(12) United States Patent
Oka et al.

(10) Patent No.: US 6,451,710 B1
(45) Date of Patent: Sep. 17, 2002

(54) METHOD OF MANUFACTURING MULTI-LAYER PRINTED WIRING BOARD

(75) Inventors: Seiji Oka; Satoshi Yanaura; Yasuo Kawashima; Takeshi Muraki, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/875,249

(22) Filed: Jun. 7, 2001

(30) Foreign Application Priority Data

Jul. 7, 2000 (JP) .......................... 2000-206035

(51) Int. Cl.[7] ............................. H01L 21/469
(52) U.S. Cl. .................. 438/778; 438/612; 428/209; 257/779
(58) Field of Search ................ 438/584, 618, 438/620, 622, 624

(56) References Cited

U.S. PATENT DOCUMENTS 6,284,353 B1 * 9/2001 Takada et al. ............ 428/209

6,326,559 B1 * 12/2001 Yoshioka et al. ........... 174/261

FOREIGN PATENT DOCUMENTS

JP    9-246728 A    9/1997

* cited by examiner

Primary Examiner—David Nelms
Assistant Examiner—Dung Anh Le
(74) Attorney, Agent, or Firm—Leydig, Voit & Mayer, Ltd.

(57) ABSTRACT

A method of manufacturing highly reliable and highly dense printed wiring board which is not warped even by the application of pressure and heat in manufacturing the multi-layer printed wiring board. The highly precise and highly dense multi-layer printed wiring board is realized by using an uncured resin sheet reinforced with fiber as an interlayer insulating layer, forming non-through holes in the uncured resin sheet using a laser beam, filling the non-through holes with a conductive paste, half-curing the conductive paste to form a wiring material, and sticking the wiring material onto the wiring substrate by application of pressure and heat, without causing a deviation in position even in applying pressure and heat.

8 Claims, 4 Drawing Sheets

FIG. 1A
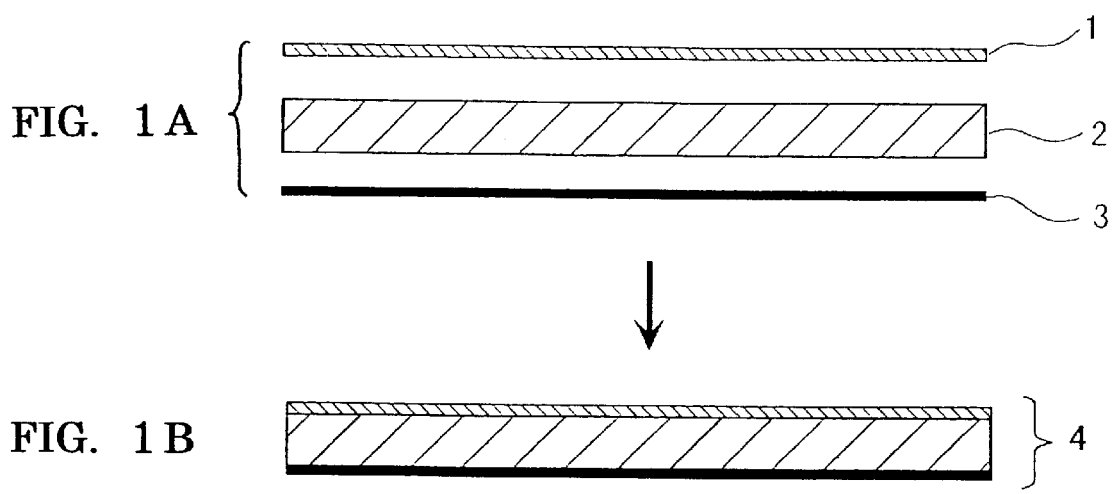
FIG. 1B
FIG. 2
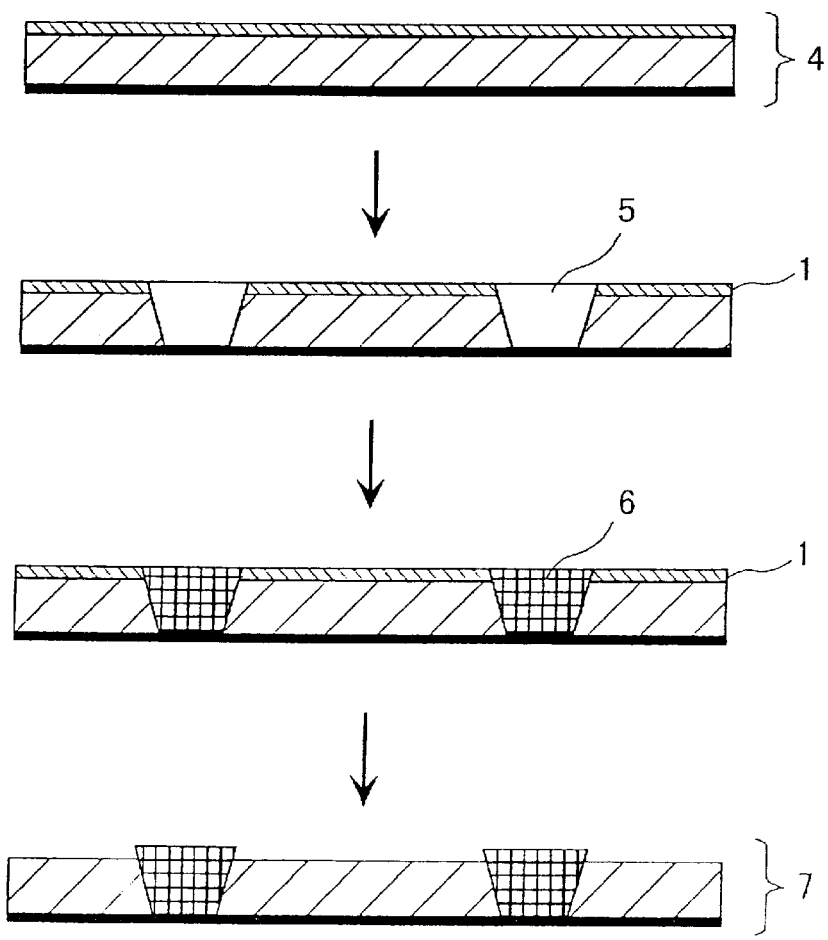

METHOD OF MANUFACTURING MULTI-LAYER PRINTED WIRING BOARD

BACKGROUND OF THE INVENTION

1. Field of the Invention

The present invention relates to a method of manufacturing a highly dense multi-layer printed wiring board using laser drilling.

2. Description of the Related Art

FIG. 5 is a diagram illustrating a conventional method of manufacturing a multi-layer printed wiring board disclosed in Japanese Patent Laid-Open No. Hei 9-246728. According to the conventional method of manufacturing a multi-layer printed wiring board, a varnish is applied to an organic film or a metal foil, and the solvent is removed by drying to form an insulating adhesive layer. Then, a cover film is stuck thereon, and the surface of the film is irradiated with a laser beam to form a non-through hole. Next, the non-through hole is filled with conductive paste, which is then half-cured by heating. Thereafter, the cover film is peeled off to form a single layer substrate. Then, the single layer substrate of the single layer is overlapped in position on the surface of the inner substrate having an inner circuit formed therein in such a manner that the metal foil is on the outer side, with the application of pressure and heat. Finally, the metal foil is etched to produce a multi-layer printed wiring board having a conductive pattern formed thereon.

In the conventional method of manufacturing multi-layer printed wiring board, the interlayer insulating layer (insulating adhesive layer) has not been reinforced with a fiber or the like and has a low rigidity. Therefore, if there exists a difference in the coefficient of thermal expansion between the inner board and the interlayer insulating layer, the wiring board warps when it is heated for laminating the interlayer insulating layer, resulting in a decrease in the reliability of junction portions of the mounting parts.

SUMMARY OF THE INVENTION

This invention was accomplished in order to eliminate such a problem, and provides a method of manufacturing highly reliable and highly densely printed wiring board which are not warped even by the application of pressure and heat, by using an uncured resin sheet reinforced with a fiber as an interlayer insulating layer, forming non-through holes by using a laser beam, filling the non-through holes with a conductive resin, temporarily curing the conductive resin and, then, connecting it to the wiring substrate by the application of pressure and heat.

The method of manufacturing multi-layer printed wiring board of this invention comprises the steps of:

(a) stacking to adhere a conductive film on at least one surface of an uncured adhesive resin sheet containing a fiber or a filler;

(b) irradiating a predetermined portion on the other surface of said uncured resin sheet with a laser beam to form, in said uncured resin sheet, a through hole which is tapered in cross section to expose said conductive film;

(c) filling said through hole with a conductive material to form an interlayer conductor to render the one surface and the other surface of said uncured resin sheet conductive to each other;

(d) stacking to adhere the other surface of said uncured resin sheet containing the portion of forming said interlayer conductor on at least one surface of an inner substrate that has wiring layers on both surfaces thereof;

(e) curing said uncured resin sheet; and (f) patterning said conductive film into a predetermined wiring shape.

According to the method of manufacturing multi-layer printed wiring board of the invention, a non-adhesive resin sheet may be overlapped on the other surface of the uncured resin sheet in the step (a), and the non-adhesive resin sheet may be peeled off between the step (c) and the step (d).

According to the method of manufacturing multi-layer printed wiring board of the invention, the conductive material may be an uncured conductive material, the uncured conductive material may be half-cured to form a half-cured conductive material in the step (c), and the half-cured conductive material may be cured in the step (e).

According to the method of manufacturing multi-layer printed wiring board of the invention, the half-cured resin sheet may contain any fiber of glass, wholly aromatic polyamide or polyacrylate.

BRIEF DESCRIPTION OF THE DRAWINGS

FIGS. 1A and 1B are sectional views illustrating a method of manufacturing a material for a multi-layer printed wiring board according to the invention;

FIG. 2 is a sectional view illustrating a method of manufacturing a prepreg sheet with a conductive paste according to the invention;

DETAILED DESCRIPTION OF THE PREFERRED EMBODIMENT

Figure 3A:
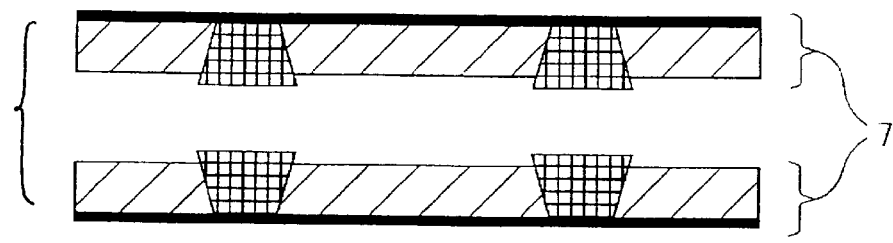
FIGS. 3A to 3C are sectional views illustrating a method of manufacturing a multi-layer printed wiring board according to the invention.
Figure 3B:
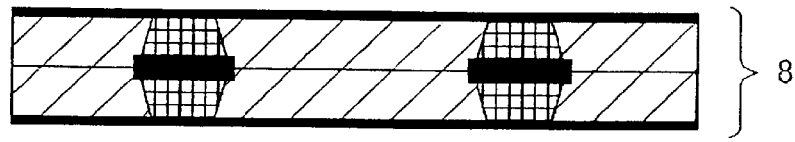
Figure 3C:
Figure 4A:
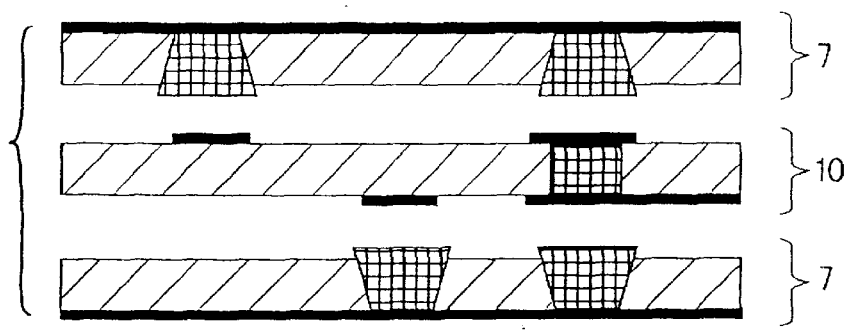
FIGS. 4A to 4E are sectional views illustrating the method of manufacturing the multi-layer printed wiring board according to the invention.
Figure 4B:
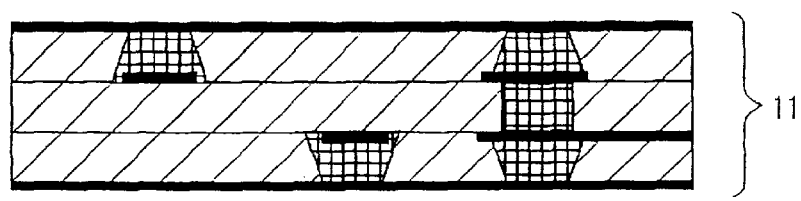
Figure 4C:
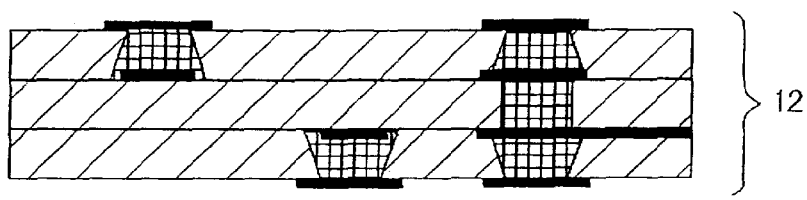
Figure 4D:
Figure 4E:
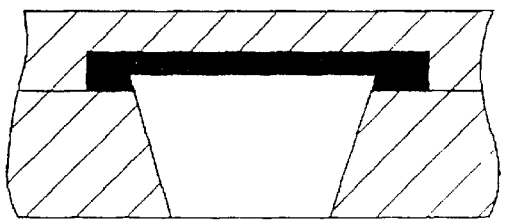
Figure 5:
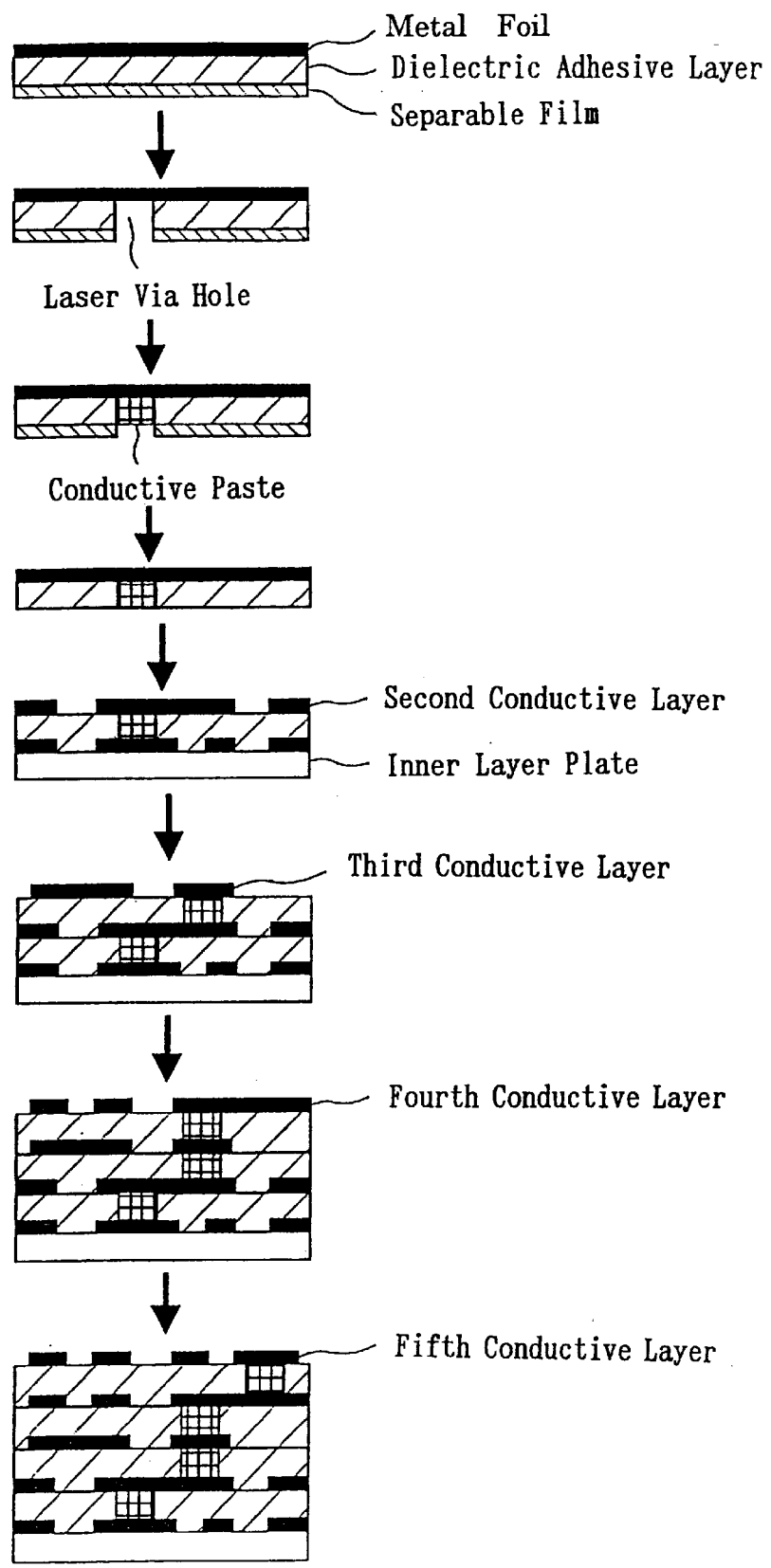
FIG. 5 is a sectional view illustrating a conventional method of manufacturing a multi-layer printed wiring board.

FIGS. 1 to 4B are views illustrating a method of manufacturing multi-layer printed wiring board according to the invention as viewed in cross section. In FIG. 1A, an uncured resin sheet (hereinafter also referred to as prepreg) 2 is sandwiched between a cover film 1 and a metal foil 3, and is molded using a laminator or the like to produce a material 4 for the wiring board (FIG. 1B). Referring to FIG. 2, non-through holes 5 are drilled in the thus-obtained material 4 for the wiring board by using a laser beam (not shown) and are filled with a thermosetting conductive paste 6. Thereafter, the thermosetting conductive paste 6 is half-cured by heating, and the cover film 1 is peeled off to produce a prepreg sheet 7 with conductive paste. Referring to FIGS. 3A to 3C, the thus obtained prepreg sheets 7 with conductive paste are positioned in such a manner that the conductive pastes are opposed to one another, and are heat-stuck using the laminator or the like to produce a double-sided wiring board 8. The metal foils of the double-sided wiring board 8 are then etched to form predetermined circuit patterns, to produce a double-sided printed wiring board 9. Referring, further, to FIGS. 4A to 4D, the prepreg sheets 7 with conductive paste are positioned on both surfaces of a glass epoxy double-sided printed wiring board 10 in such a manner that the land portions are opposed to the conductive paste, and are struck by using the laminator or the like to obtain a four-layer laminated board 11. The metal foils 3 formed on both surfaces of the four-layer laminated plate 11 are etched to form predetermined circuit patterns, to produce a four-layer printed wiring board 12. The prepreg sheets 7 with conductive paste are struck in the same manner with the four-layer printed wiring board 12 as a center and predetermined circuit patterns are formed, to produce a six-layer printed wiring board 13.

The prepreg sheet used in this invention is produced by impregnating a fiber with a resin which has been dissolved in a solvent in advance and passing the fiber through a drying furnace. Therefore, the remaining solvent can be suppressed to be not larger than 0.5% by weight. When the amount of the remaining solvent exceeds 0.5%, the layers of the printed wiring board peel due to vaporization of the remaining solvent in the step of manufacturing the wiring board by applying the pressure and heat, giving rise to the occurrence of defects.

By using the prepreg sheet reinforced with fiber as an interlayer insulating film, further, it is allowed to impart expansion property at low temperatures and rigidity to the printed wiring board and, hence, to improve reliability of surface mounting. As the fiber material for imparting expansion property at low temperatures and rigidity to the printed wiring board, there can be preferably used a glass cloth comprising an opened fiber, a nonwoven glass fabric comprising chiefly a glass fiber, an organic nonwoven fabric comprising chiefly a wholly aromatic polyamide, or an organic nonwoven fabric comprising chiefly a liquid crystal polymer of the polyacrylate type.

By using the glass cloth of opened fiber in which both the warps and wefts have widths which are about 6 to 10 times as great as the thicknesses thereof, it is allowed to form circuit patterns exhibiting increased surface flatness, high precision and high density, as well as to obtain property of being uniformly drilled by a laser beam. When both the warps and wefts have widths which are not more than 6 times as great as the thicknesses thereof, the surface flatness is lost and it becomes difficult to form circuit patterns maintaining high precision. Besides, the densities of the warps in the vertical direction and of the wefts undergo a change in the prepreg. In the step of drilling using a laser beam, therefore, there occurs a difference in the number of times of irradiating the laser beam for drilling and in the shape of the holes after drilled with the laser beam. When the widths of both the warps and wefts become in excess of 10 times as great as the thicknesses thereof, on the other hand, the surface flatness of the printed wiring board increases, but the glass yarns are fluffed in the step of manufacturing the prepreg, giving rise to the occurrence of twisting which greatly hinders the productivity.

By using the nonwoven glass fabric obtained by crushing the glass fiber, wholly aromatic polyamide nonwoven fabric or liquid crystal polymer nonwoven fabric of the polyacrylate type, further, there is obtained a printed wiring board exhibiting good surface flatness, expansion property at low temperatures and rigidity. Further, use of the organic nonwoven fabric such as the wholly aromatic polyamide nonwoven fabric or the liquid crystal polymer nonwoven fabric of the polyacrylate type makes it possible to decrease the weight of the printed wiring board.

As the resin with which the fiber is to be impregnated, there can be used an epoxy resin, a BT (bismaleimide trizine) resin, a polyimide resin, a Teflon-type resin, or a mixture of two or more kinds thereof to meet the required properties.

The thickness of the prepreg sheet is related to the thickness of the pattern of the inner substrate and the size of the through holes. From the standpoint of the inner substrate's filling property relates to the conductive paste, however, the thickness of the prepreg sheet must not be smaller than at least the thickness of the pattern of the inner substrate. In general, it is desired that the prepreg sheet has a thickness of from about 20 to about 200 $\mu$m.

To obtain the prepreg sheet reinforced with a half-cured fiber on one surface of the metal foil and to obtain a material for wiring board having the cover film laminated on the surface of the prepreg sheet, the prepreg sheet is sandwiched between the metal foil and the cover film and is molded by using a vacuum laminator or the like. It is desired that the surface of the metal foil facing the surface of the prepreg sheet has been coarsened from the standpoint of adhesion strength. It is further desired that the surface of the cover film has been so treated as can be easily peeled off.

The metal foil used in this invention is the one of copper, nickel, aluminum or the like. As the printed wiring board, however, a copper foil is preferably used. It is desired that the metal foil has a thickness of from about 3 to about 100 $\mu$m. When the thickness is smaller than 3 $\mu$m, the foil is advantageous for forming fine patterns but arouses a problem concerning being drilled through by a laser beam and handling. When the thickness exceeds 100 $\mu$m, on the other hand, difficulty is involved in finely forming the circuit patterns.

The cover film must be easily drilled with a laser beam so as to form non-through holes. Besides, the cover film must have heat resistance since it is subjected to the step of half-curing the conductive paste by heating. As the cover film, there can be used a polytetrafluoroethylene, a polyethylene terephthalate, a polypropylene, a polyethylene fluoride or a polyvinylidene fluoride.

It is desired that the thickness of the cover film is not smaller than 5 $\mu$m so that it can be laminated without developing wrinkles but is not so large from the standpoint of the rate of laser drilling. From the standpoint of handling, however, the cover film must be thick to some extent. From such a point of view, it is desired that the cover film has a thickness of from about 10 to about 70 $\mu$m.

The laser drilling is used for forming the non-through holes. As the laser for drilling, there can be used an excimer laser, a YAG laser or a $CO_2$ laser. Among them, the $CO_2$ laser is preferably used from the standpoint of working rate and working cost.

The non-through holes usually have a diameter of from about 50 to about 200 $\mu$m.

When the non-through holes are to be formed by using the $CO_2$ laser, the residue of resin may remain on the surface of the copper foil irradiated with the laser beam. After the drilling using the laser beam, therefore, a processing called desmear processing is executed for removing the resin. AS the desmear processing, the cleaning using a plasma device is preferably executed.

The non-through holes are filled with the conductive paste preferably by screen printing or roll coater method. The excess of conductive paste applied around the non-through holes during the printing or the roll-coating can be easily removed by peeling the organic cover film off.

The conductive substance used for the conductive paste chiefly comprises a powder of Cu, Ag and an alloy thereof, and exhibits a stable conductivity.

EXAMPLES

In the following examples are described several preferred embodiments to illustrate the invention. However, it is to be understood that the invention is not intended to be limited to the specific embodiments.

Example 1

First, described below is a method of obtaining a prepreg sheet used in the method of manufacturing multi-layer printed wiring board of the invention. The prepreg sheet is obtained by impregnating a base member of nonwoven fabric with varnish, drying the base member in a drying furnace at a temperature of about 130 to 140° C. for about 7 to 15 minutes to remove the solvent and to promote the curing reaction of the impregnated resin.

Here, as the nonwoven fabric, there was used the one (70 µm-thick Thermount, produced by Du Pont-Teijin Advanced Paper Co.) produced from a para-type wholly aromatic polyamide fiber.

The epoxy resin varnish with which the nonwoven fabric is to be impregnated was prepared by blending 90 parts by weight of epoxy resin Epikote 5046 (manufactured by Yuka Shell Epoxy Co.), 10 parts by weight of Epikote 5048 (manufactured by Yuka Shell Epoxy Co.) and 2 parts by weight of a dicyandiamide (manufactured by Nippon Carbide Co.) as a curing agent, followed by the addition of imidazole as a catalyst and methyl ethyl ketone, so that the solid components were 50 parts by weight.

First, the prepreg sheet was sandwiched by a metal foil which was an electrolytic copper foil having a thickness of 18 µm and a coarse surface and by a cover film that was a polyethylene terephthalate film having a parting property and a thickness of 20 µm, and was molded as a unitary structure using the vacuum laminator to obtain a material for wiring board. Next, the thus formed wiring board material was drilled by using a $CO_2$ laser beam to form non-through holes having a diameter of 100 µm, followed by a plasma cleaning processing for removing residue of the wiring board material from the non-through holes.

Next, the non-through holes were filled with a conductive paste (DD-1801 manufactured by Kyoto Elex Co.) from the upper side of the polyethylene terephthalate film surface by the screen-printing method, followed by drying at 100° C. for 15 minutes to half-cure the conductive paste. Thereafter, the film was peeled off to obtain an inner wiring board.

Next, the inner wiring boards in a state where the conductive paste in the non-through holes is protruding beyond the prepreg sheet, were overlapped one upon the other in position as a unitary structure in vacuum with the application of a pressure of 30 kg/cm² and a temperature of 175° C. for 90 minutes thereby to obtain a double-sided copper-clad laminate board. Thereafter, the copper foils were etched to obtain a double-sided copper-clad laminate wiring board having circuit patterns of line/space of 40 µm/40 µm. The thus obtained double-sided copper-clad laminate wiring board exhibited a bending modulus of elasticity of 1010 kgf/mm² and a coefficient of thermal expansion in the plane direction of 12 ppm/° C.

Example 2

A prepreg sheet with conductive paste was prepared in the same manner as in Example 1 but using an electrolytic copper foil having a thickness of 9 µm as a metal foil. Next, the material for wiring board was overlapped in position in such a manner that the metal foil was on the outer side, on the surfaces of the 0.1 mm-thick glass epoxy double-sided printed wiring board having circuit patterns formed of a circuit-forming copper foil of a thickness of 18 µm, having line/space of 75 µm/75 µm and a 90 m-thick land for interlayer connection by applying the pressure and heat in the same manner as in Example 1 to obtain a four-layer copper-clad laminate plate. Thereafter, the copper foil of the outermost layer was etched to obtain a four-layer printed wiring board having circuit patterns with line/space of 25 µm/25 µm. The thus obtained four-layer printed wiring board exhibited a bending modulus of elasticity of 1120 kgf/mm² and a coefficient of thermal expansion in the plane direction of 12.1 ppm/° C.

Example 3

A prepreg sheet was prepared in the same manner as in Example 2 but using a nonwoven fabric (Vecrus: manufactured by Kuraray Co.) prepared from a liquid crystal polymer fiber of the polyacrylate type for reinforcement. After the four-layer printed wiring board was prepared, a six-layer printed wiring board was manufactured through the same steps. The line/space was 25 µm/25 µm in the first layer, in the second layer, in the fifth layer and in the sixth layer. The obtained six-layer printed wiring board exhibited a bending modulus of elasticity of 1120 kgf/mm² and a coefficient of thermal expansion in the plane direction of 13.3 ppm/° C.

Comparative Example

A multi-layer printed wiring board was prepared in the same manner as in Example 1 but using R-0880 manufactured by Matsushita Denko Co. as a prepreg sheet and a 20 µm-thick polyethylene terephthalate film as a cover film. An electrolytic copper foil of a thickness of 18 µm was stuck to the surface on one side of the prepreg sheet R-0880, and an epoxy resin adhesive layer which has not been reinforced with fiber was provided maintaining a thickness of 70 µm on the other surface thereof. The multi-layer printed wiring board obtained by using the above prepreg sheet permitted the wiring board to be cracked due to the warping of the substrate in the step of forming circuit patterns because of low rigidity of the wiring board itself, and the circuit pattern could not be formed by etching. The obtained wiring board exhibited a bending modulus of elasticity of 217 kgf/mm² and a coefficient of thermal expansion in the plane direction of 28.5 ppm/° C.

According to the method of manufacturing multi-layer printed wiring board of the invention as described above, the uncured resin sheet reinforced with a fiber is used as an interlayer insulating film, non-through holes are formed in the uncured resin sheet by using a laser beam and are filled with a conducting paste which is, then, half-cured to prepare a wiring material. The wiring material is then stuck to the wiring substrate by the application of pressure and heat to obtain highly precise and highly dense multi-layer printed wiring board without developing positional deviation in the step of applying the pressure and heat.

What is claimed is:

1. A method of manufacturing a multi-layer printed wiring board comprising:

stacking and adhering a conductive film on a first surface of an uncured adhesive resin sheet containing one of a fiber and a filler;

irradiating a portion on a second surface of said uncured resin sheet with a laser beam to form, in said uncured resin sheet, a through hole which is tapered in cross section, exposing said conductive film;

filling the through hole with a conductive material to form an interlayer conductor to electrically connect the first and second surfaces of said uncured resin sheet to each other;

stacking and adhering the second surface of said uncured resin sheet containing said interlayer conductor on at least one surface of an inner substrate that has wiring layers on both surfaces;

curing said uncured resin sheet; and patterning said conductive film into a wiring shape.

2. The method of manufacturing a multi-layer printed wiring board according to claim 1, including stacking a non-adhesive resin sheet on the second surface of said uncured resin sheet, and peeling said non-adhesive resin sheet after filling the through hole and before stacking said uncured resin sheet on said inner substrate.

3. The method of manufacturing a multi-layer printed wiring board according to claim 1, wherein said conductive material is an uncured conductive material, and including half curing said uncured conductive material immediately after filling the through hole, and fully curing said conductive material in curing said uncured resin sheet.

4. The method of manufacturing a multi-layer printed wiring board according to claim 2, wherein said conductive material is an uncured conductive material, and including half curing said uncured conductive material immediately after filling the through hole, and fully curing said conductive material in curing said uncured resin sheet.

5. A method of manufacturing multi-layer printed wiring board according to claim 1, in which said uncured adhesive sheet includes a fiber and said fiber is selected from the group consisting of glass, wholly aromatic polyamide, and polyacrylate.

6. A method of manufacturing multi-layer printed wiring board according to claim 2, in which said uncured adhesive sheet includes a fiber and said fiber is selected from the group consisting of glass, wholly aromatic polyamide, and polyacrylate.

7. A method of manufacturing multi-layer printed wiring board according to claim 3, in which said uncured adhesive sheet includes a fiber and said fiber is selected from the group consisting of glass, wholly aromatic polyamide, and polyacrylate.

8. A method of manufacturing multi-layer printed wiring board according to claim 4, in which said uncured adhesive sheet includes a fiber and said fiber is selected from the group consisting of glass, wholly aromatic polyamide, and polyacrylate.

* * * * *